United States Patent [19]

Otto

[11] 3,931,509

[45] Jan. 6, 1976

[54] APPARATUS FOR OBTAINING THE CONVOLUTION AND/OR CORRELATION OF SIGNALS UTILIZING ACOUSTIC WAVES

[75] Inventor: Oberdan W. Otto, Los Angeles, Calif.

[73] Assignee: The Board of Trustees of Leland Stanford Jr. University, Stanford, Calif.

[22] Filed: Mar. 11, 1974

[21] Appl. No.: 449,948

[52] U.S. Cl................... 235/181; 333/30 R; 333/72

[51] Int. Cl.²....................... G06G 7/19; H03H 7/30

[58] Field of Search................. 235/181; 331/107 A; 307/88.3; 310/8.1, 8.2, 8.3; 333/30 R, 72

[56] References Cited

UNITED STATES PATENTS

| | | | |
|---|---|---|---|
| 3,568,102 | 3/1971 | Tseng | 331/107 A |
| 3,757,256 | 9/1973 | Whitehouse et al. | 333/30 R |
| 3,770,949 | 11/1973 | Whitehouse et al. | 235/181 |
| 3,774,019 | 11/1973 | Cook | 235/181 |
| 3,800,247 | 3/1974 | Tancrell et al. | 333/30 R |

OTHER PUBLICATIONS

Ash et al., Acoustic Surface-Wave Parametric Amplifiers, IBM Technical Disclosure Bulletin, Vol. 14, No. 3, Aug. 1971, pp. 903–904.

*Primary Examiner*—Felix D. Gruber
*Attorney, Agent, or Firm*—Paul B. Fihe

[57] ABSTRACT

Signal processing apparatus wherein true correlation or convolution of signals is obtained by a third order nonlinear parametric acoustic wave interaction in a piezoelectric medium.

7 Claims, 1 Drawing Figure

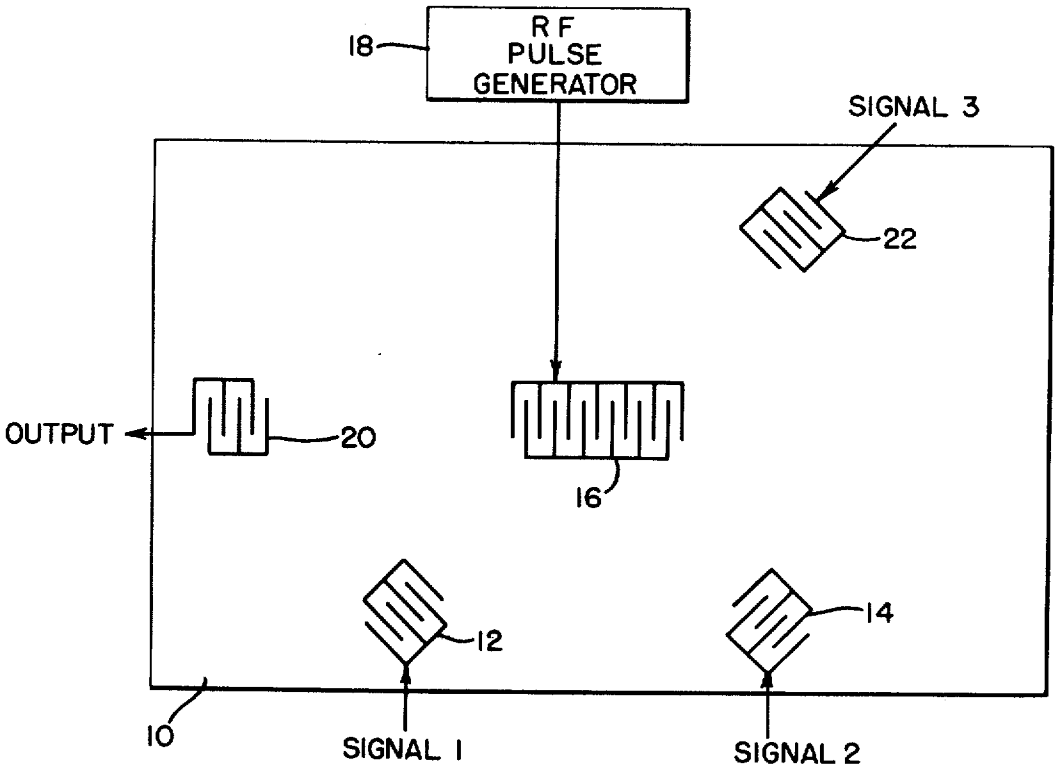
RF
PULSE
GENERATOR
18
SIGNAL 3
22
OUTPUT
20
16
12
14
10
SIGNAL 1
SIGNAL 2

APPARATUS FOR OBTAINING THE CONVOLUTION AND/OR CORRELATION OF SIGNALS UTILIZING ACOUSTIC WAVES

FIELD OF THE INVENTION

The present invention relates generally to signal processing apparatus and, more particularly, to signal processing apparatus arranged to perform certain operations, such as correlation and convolution, utilizing the nonlinear parametric interaction of acoustic waves.

BACKGROUND OF THE INVENTION

Acoustic waves have been successfully utilized to perform both convolution and correlation of two signals in real time. For example, in U.S. Pat. No. 3,760,172 issued Sept. 18, 1973 to Calvin F. Quate, oppositely-propagating acoustic waves generated by the application of two signals to a piezoelectric medium are arranged to provide a second order parametric interaction adjacent an output electrode to provide the physical realization of convolution $C_u$ of two time functions $f(t)$ and $g(t)$ which is mathematically expressed as $$C_u = \int f(\tau)\, g(t-\tau)\, d\tau$$

$t$ being representative of the time displacement between the two functions. The time translation of the two functions is realized because of the opposite propagation directions of the two waves, the indicated multiplication is achieved by the nonlinear parametric interaction and the integration by the coupling of the product function to the output electrode. In the mentioned Quate U.S. Pat. No. 3,760,172, the process is achieved specifically with bulk acoustic waves, but surface acoustic waves can also be utilized as explained by Gordon S. Kino in U.S. patent application Ser. No. 190,342, and now U.S. Pat. 3,816,753. Furthermore, the nonlinearities obtained in the acoustic medium are relatively weak and various techniques have been subsequently developed to improve the efficiency of operation, such as utilization of the nonlinear properties of semiconductors as explained in the article "Signal Processing by Parametric Interactions in Delay-Line Devices" by Kino et al. in IEEE Transactions, Vol. MTT-21, No. 4, April 1973 (pp. 244–255).

Correlation, the time-reversed operation mathematically represented by $$C_r = \int f(\tau)\, g(\tau-t)\, d\tau$$

is particularly significant for utilization in so-called "correlation" radars and pattern recognition, but is not so simply achieved because of the time-reversal requirement. Typically, it requires a two-step operation, first a time reversal of a signal and then a convolution operation as briefly described, one specific example being described in detail in the above-mentioned Kino U.S. patent application Ser. No. 190,342.

SUMMARY OF THE PRESENT INVENTION

Accordingly, it is the general objective of the present invention to provide signal processing apparatus enabling the realization of true convolution or correlation in a single step employing a third order nonlinear parametric interaction of acoustic waves.

To achieve such objective, the two signals to be processed, that is convolved or correlated, are introduced by appropriately disposed electroacoustic transducers on a piezoelectric medium to generate two acoustic wave signals which propagate so as to attain an overlap position. At such overlap position and precisely at the time of signal overlap, a switching signal is applied, thus providing, through establishment of the known frequency conservation and phase matching conditions, a third order nonlinear parametric interaction of the signals, the resultant product function being then coupled to an output transducer which performs the integration function, thus to provide an output signal which is the true convolution or correlation of the input signals.

The position of the input transducers will, of course, determine the propagation paths of the two acoustic signals and their relative positions on the same or opposite sides of a predetermined axis will consequently determine whether the output will constitute the convolution or time-reversed correlation of the signals, as will be explained in detail hereinafter.

The switching signal can be generated by a transducer at the time and position of input signal overlap, thus to generate an acoustic signal representative of the product function of the input signals which propagates toward an appropriately positioned output transducer which in the well-known fashion couples out the acoustic signal so as to integrate the same.

Alternatively, the switching signal can itself be generated as an acoustic wave which in timed relation intersects the position of signal wave overlap thus to provide the third order parametric interaction with the resultant product function of the signals.

BRIEF DESCRIPTION OF THE DRAWING

The stated objective of the invention and the manner in which it is achieved, as summarized hereinabove will be more fully understood by reference to the following detailed description and operational explanation of the exemplary embodiment of the invention diagrammatically illustrated in a single top plan view in the accompanying drawing.

DETAILED DESCRIPTION OF THE EXEMPLARY EMBODIMENT OF THE INVENTION

As shown in the drawing, for a correlation operation, a first radio frequency signal constituting a time function $f_1(t)$ is applied to a first interdigital transducer 12 of well known design on a piezoelectric medium 10 so as to generate a surface acoustic wave signal which propagates toward a central position at the intersection of the X (vertical) and Z (horizontal) axes on the piezoelectric material.

A second radio frequency signal $f_2(t)$ to be correlated with the first is, in turn, applied to another interdigital transducer 14 located in an angularly symmetrical position on the opposite side of the X axis so as to generate a second surface acoustic wave signal which propagates toward the central position previously defined at the intersection of the X and Y axes. If, as illustrated, the two transducers 12, 14 are equidistant from the central position and the signals are simultaneously applied, they will reach the central position simultaneously so as to overlap at such position. Such overlap at the central position is essential to interaction, but if different transducer positions are needed for any reason, a variation in the time of signal introduction will still enable the required signal overlap.

At the central signal overlap position, a third interdigital transducer 16 is disposed with its fingers in parallelism to the X axis, the transducer having sufficient overall spatial extent in the X and Z directions so that the entire overlapping input acoustic signals are encompassed thereby.

Precisely at the time of signal overlap, a switching signal in the form of a short radio frequency pulse $\delta(t)$ having a frequency determined by the frequencies of the input signals and the locations of the transducers 12, 14, as will be explained hereinafter, is applied to the central transducer 16 from a tunable radio frequency pulse generator 18 to provide a third order nonlinear parametric interaction of the three signals. An output acoustic wave signal representative of the product function of the two input signals in the manner explained in detail in the previously referred to Patent, patent application and article, is generated to travel to the left in the −Z direction towards an output interdigital transducer 20 which couples out the acoustic signal in a fashion which integrates the same to provide the ultimate correlation output radio frequency signal, $f_3(\tau', 0)$.

By way of explanation, if the switching signal $\delta(t)$ constitutes a pulse of width $\Delta t$ and amplitude A, and is applied at the time of signal overlap ($t$=0), the output signal can be represented by $$f_3(\tau',0) = \frac{-IA\Delta t}{\eta_{1x}} \int d\tau f_1(\tau) \cdot f_2\left(\tau\right)\frac{\eta_{2x}}{\eta_{1x}} + \tau' \frac{\eta_{2x}}{\eta_{3z}}\left(1 + \frac{\eta_{12}}{\eta_{1x}}\right)$$

where $$\eta_{1x} = \frac{k_1 \cdot e_x}{\omega_1}$$

$k_1$ being wavevector and $\omega_1$ the radian frequency of signal $f_1(t)$, and $e_x$ the unit vector along direction X. $\eta_{12}$, $\eta_{2x}$, $\eta_{32}$ are the corresponding quantities for other waves in the indicated X and Z directions $t = t$ $\tau = t - \eta_{1x} X - \eta_{1z} Z$ $\tau' = t - \eta_{3z} Z$ and I = is a "window" function which determines the limits of integration (normally $\pm\infty$)

If, as shown, both input signals propagate in the same "X" direction, $\eta_{2x}/\eta_{1x}$ is positive, and correlation will result. On the other hand, if the input waves propagate in opposite X directions, $\eta_{2x}/\eta_{1x}$ is negative, and the operation, as indicated by substitution in the above equation will be convolution. Specifically, if $\eta_{2x}/\eta_{1x}$ = 1, the correlation or convolution will be "true." Accordingly, in the illustrated embodiment, if $\eta_{2x} = \eta_{1x}$, true correlation will result.

Additionally, the frequency $\omega$ of the ratio frequency pulse $\delta$ (t) can be varied to meet the necessary conditions for parametric interaction, frequency conservation and phase matching, dependent upon the input signal frequencies and the transducer dispositions. By way of example, if the transducers 12, 14 are symmetrically located at 45° relative to the X axis, as specifically illustrated, and input signal frequencies $\omega_1$ and $\omega_2$ are the same, then the pulse frequency will be $\sqrt{2}\,\omega_1$. It is to be noted that in this specific case, the periodicity of the transducer 16 is zero and can thus take the form of a plate transducer in the manner explained in the referred to Kino patent application Ser. No. 190,342. In turn, the output signal frequency $\omega_3$ will also be equal to $\sqrt{2}\,\omega_1$.

A similar third order parametric interaction can also be obtained, as will be apparent to those skilled in the art, by a slight operational variation wherein the "switching" function is achieved by introduction of the switching pulse to the transducer 20 so as to propagate towards the central transducer 16 and arrive thereunder simultaneously with the two input signals from the transducers 12 and 14, the central transducer 16 then extracting the interacted signals thus to perform the integrating function and provide the correlation output signal.

If one desires to perform the convolution operation, as previously indicated, the value of $\eta_{2x}/\eta_{1x}$ must be negative, which can be easily achieved by introduction of a time function signal $f_4(t)$ to a transducer 22 located above the Z axis and to the right of the X axis by an angular amount of 45° so as to lie opposite the first signal transducer 12. In all other respects the operation is the same and need not be repeated.

With the specific structure as described, the lattice nonlinearities in the piezoelectric medium 10 are utilized to provide the parametric interaction, but it will be clear that such interaction can also be achieved in other well established manners such as the charge nonlinearities obtained through use of an associated semiconductor as explained in the mentioned Kino et al article.

Accordingly, various alterations or modifications in the specifically described arrangement can obviously be made within the spirit of the invention, and the scope of the invention is to be construed only as recited in the appended claims.

What is claimed is:

1. Signal processing apparatus which comprises a piezoelectric medium, a pair of input transducers disposed adjacent said medium in positions to enable the coupling of two electromagnetic input signals into said medium to generate first and second acoustic wave signals which propagate at different angles and overlap at a predetermined position, means for applying a switching signal to said medium so as to parametrically interact with the overlapped acoustic wave signals, and output transducer means on said medium at a position to couple energy from the parametrically interacted signals to provide an integrated output signal.

2. Signal processing apparatus according to claim 1 wherein said pair of input transducers are disposed on the same side of said output transducer.

3. Signal process apparatus according to claim 1 wherein said pair of input transducers are disposed on opposite sides of said output transducer.

4. Signal processing apparatus according to claim 1 wherein said input transducers are symmetrically disposed at equal angular positions relative to the position of parametric interaction.

5. Signal processing apparatus according to claim 1 wherein said switching signal applying means includes a transducer located at the predetermined position of input signal overlap.

6. Signal processing apparatus according to claim 1 wherein said switching signal applying means includes means for applying a radio frequency pulse of predetermined frequency to establish the conditions for parametric interaction.

7. Signal processing apparatus according to claim 6 wherein said switching signal applying means includes a tunable radio frequency pulse generator.

* * * * *